(12) United States Patent
Kim et al.

(10) Patent No.: US 10,153,336 B2
(45) Date of Patent: Dec. 11, 2018

(54) SEMICONDUCTOR DEVICE AND A DISPLAY DEVICE INCLUDING THE SAME

(71) Applicant: SAMSUNG DISPLAY CO., LTD., Yongin-si, Gyeonggi-Do (KR)

(72) Inventors: Waljun Kim, Yongin-si (KR); Yeonhong Kim, Yongin-si (KR); Junghyun Kim, Yongin-si (KR); Taejin Kim, Yongin-si (KR); Kiwan Ahn, Yongin-si (KR); Yongjae Jang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/583,244

(22) Filed: May 1, 2017

(65) Prior Publication Data

US 2017/0317159 A1 Nov. 2, 2017

(30) Foreign Application Priority Data

May 2, 2016 (KR) .................. 10-2016-0054105

(51) Int. Cl.
*H01L 29/08* (2006.01)
*H01L 29/18* (2006.01)
*H01L 21/00* (2006.01)
*H01L 27/32* (2006.01)
*H01L 27/12* (2006.01)

(52) U.S. Cl.
CPC ........ *H01L 27/3276* (2013.01); *H01L 27/124* (2013.01); *H01L 27/1248* (2013.01); *H01L 27/1255* (2013.01); *H01L 27/3246* (2013.01); *H01L 27/3262* (2013.01)

(58) Field of Classification Search
CPC . H01L 51/50; H01L 51/5032; H01L 51/5066; H01L 51/5271; H01L 51/56; H01L 51/504; H01L 51/5216; H01L 2924/12044; H01L 27/32; H01L 27/3276; H01L 27/3262; H01L 27/1255; H01L 27/3246; G02B 6/07
USPC ........ 438/82, 99; 257/42, E33.001, E25.008, 257/E51.018
See application file for complete search history.

(56) References Cited

U.S. PATENT DOCUMENTS

| 2015/0255523 | A1 | 9/2015 | Her |
| 2016/0012775 | A1 | 1/2016 | Jeong et al. |
| 2016/0155858 | A1* | 6/2016 | Yoo ................... H01L 29/78648 257/40 |

FOREIGN PATENT DOCUMENTS

| KR | 1020130005550 | 1/2013 |
| KR | 1020150060034 | 6/2015 |
| KR | 1020150105586 | 9/2015 |

* cited by examiner

*Primary Examiner* — Hsien Ming Lee
(74) *Attorney, Agent, or Firm* — F. Chau & Associates, LLC

(57) ABSTRACT

A semiconductor device including a semiconductor layer, a first electrode, and a second electrode. The semiconductor layer includes a first source region, a first drain region, a second source region, and a second drain region connected to a channel region. The first gate electrode is disposed below the semiconductor layer. The first gate electrode is insulated from the semiconductor layer. The first gate electrode at least partially overlaps the shared channel region. The second gate electrode is disposed above the semiconductor layer. The second gate electrode is insulated by a second gate insulating layer. The second gate electrode at least partially overlaps the channel region.

23 Claims, 12 Drawing Sheets

SEMICONDUCTOR DEVICE AND A DISPLAY DEVICE INCLUDING THE SAME

CROSS-REFERENCE TO RELATED APPLICATIONS

This application claims the benefit of Korean Patent Application No. 10-2016-0054105, filed on May 2, 2016 in the Korean Intellectual Property Office, the disclosure of which is incorporated by reference herein in its entirety.

TECHNICAL FIELD

The present invention relates to a semiconductor device and a display device including the same.

DISCUSSION OF RELATED ART

A display device is an apparatus displaying an image. Variations of display devices include a liquid crystal display (LCD), an electrophoretic display, an organic light-emitting display (OLED), an inorganic light-emitting display, a field emission display, a surface-conduction electron-emitter display, a plasma display, and a cathode ray display.

A display device may include a display element, a thin film transistor, a capacitor, and wiring. The wiring connects the display element, the thin film transistor, and the capacitor to each other. In order to provide a high resolution of the display device, high performance thin film transistors may be desirable.

SUMMARY

Exemplary embodiments of the present invention provide a semiconductor device. The semiconductor device includes a semiconductor layer, a first gate electrode, and a second gate electrode. The semiconductor layer includes a first source region, a first drain region, a second source region, and a second drain region connected to a channel region. The first gate electrode is disposed below the semiconductor layer. The first gate electrode is insulated from the semiconductor layer. The first gate electrode at least partially overlaps the channel region. The second gate electrode is disposed above the semiconductor layer. The second gate electrode is insulated from the semiconductor layer by a second gate insulating layer. The second gate electrode at least partially overlaps the channel region.

A first thin film transistor may include the channel region, the first source region, the first drain region, and the first gate electrode. A second thin film transistor may include the channel region, the second source region, the second drain region, and the second gate electrode.

A thickness of the first gate insulating layer may be different than a thickness of the second gate insulating layer.

The semiconductor device may further include an interlayer insulating layer. The interlayer insulating layer may be disposed above the second gate electrode. The semiconductor device may also include a first source electrode, a first drain electrode, a second source electrode, and a second drain electrode disposed above the interlayer insulating layer. The first source electrode, the first drain electrode, the second source electrode, and the second drain electrode may be respectively connected to the first source region, the first drain region, the second source region, and the second drain region via contact holes.

The semiconductor device may further include a capacitor. The capacitor may include a first electrode and a second electrode. The first electrode may be connected to the second gate electrode. The second electrode may be disposed above the first electrode. The second electrode may be insulated from the first electrode. The second gate electrode and the first electrode may form a single structure in a same layer.

The capacitor may include a third gate insulating layer. The third gate insulating layer may be disposed between the first electrode and the second electrode.

The first source region, the first drain region, the second source region, and the second drain region may be spaced apart from each other.

The first source region and the second source region may form a single region. The first drain region may be spaced apart from the second drain region.

The first source region may be spaced apart from the second source region. The first drain region and the second drain region may form a single region.

Exemplary embodiments of the present invention provide a display device. The display device includes the semiconductor device, a planarization layer, a pixel electrode, an opposite electrode, and an intermediate layer. The planarization layer covers the semiconductor device. The pixel electrode is disposed above the planarization layer. The pixel electrode is connected to one of the first source region, the first drain region, the second source region, or the second drain region. The opposite electrode faces the pixel electrode. The intermediate layer is disposed between the pixel electrode and the opposite electrode.

A first thin film transistor may include the channel region, the first source region, the first drain region, and the first gate electrode. A second thin film transistor may include the channel region, the second source region, the second drain region, and the second gate electrode.

The display device may further include a gate line configured to transfer a gate signal, a data line configured to transfer a data signal, and a driving voltage line configured to transfer a driving voltage. The gate line may be connected to the first gate electrode, the data line may be connected to the first source region, the driving voltage line may be connected to the second source region, and the pixel electrode may be connected to the second drain region.

A thickness of the second gate insulating layer may be greater than a thickness of the first gate insulating layer.

The display device may further include a capacitor. The capacitor may include a first electrode and a second electrode. The first electrode may be connected to the second gate electrode. The second electrode may be disposed above the first electrode. The second electrode may be insulated from the first electrode. The second gate electrode and the first electrode may form a single structure in a same layer.

The capacitor may include a third gate insulating layer. The third gate insulating layer may be disposed between the first electrode and the second electrode.

The display device may further include an auxiliary capacitor. The auxiliary capacitor might not overlap the semiconductor device.

The display device may further include a pixel-defining layer. The pixel defining layer may expose a portion of the pixel electrode, cover a surface of the pixel electrode, and define a pixel.

The intermediate layer may include an organic emission layer.

Exemplary embodiments of the present invention provide a semiconductor device. The semiconductor device includes a semiconductor layer, a first gate electrode, and a second gate electrode. The semiconductor layer includes a channel region. The first gate electrode at least partially overlaps the channel region. The second gate electrode is disposed above the semiconductor layer. The second gate electrode at least partially overlaps the channel region. The semiconductor layer overlaps the first gate electrode when viewed from above the semiconductor layer towards the substrate.

The semiconductor layer may further include a first source region, a first drain region, a second source region, and a second drain region.

A first thin film transistor may include the channel region, the first source region, the first drain region, and the first gate electrode. A second thin film transistor may include the channel region, the second source region, the second drain region, and the second gate electrode.

The first gate electrode may be insulated by a first gate insulating layer. The second gate electrode may be insulated by a second gate insulating layer.

A thickness of the first gate insulating layer may be different than a thickness of the second gate insulating layer.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION OF THE EMBODIMENTS

Figure 1A:
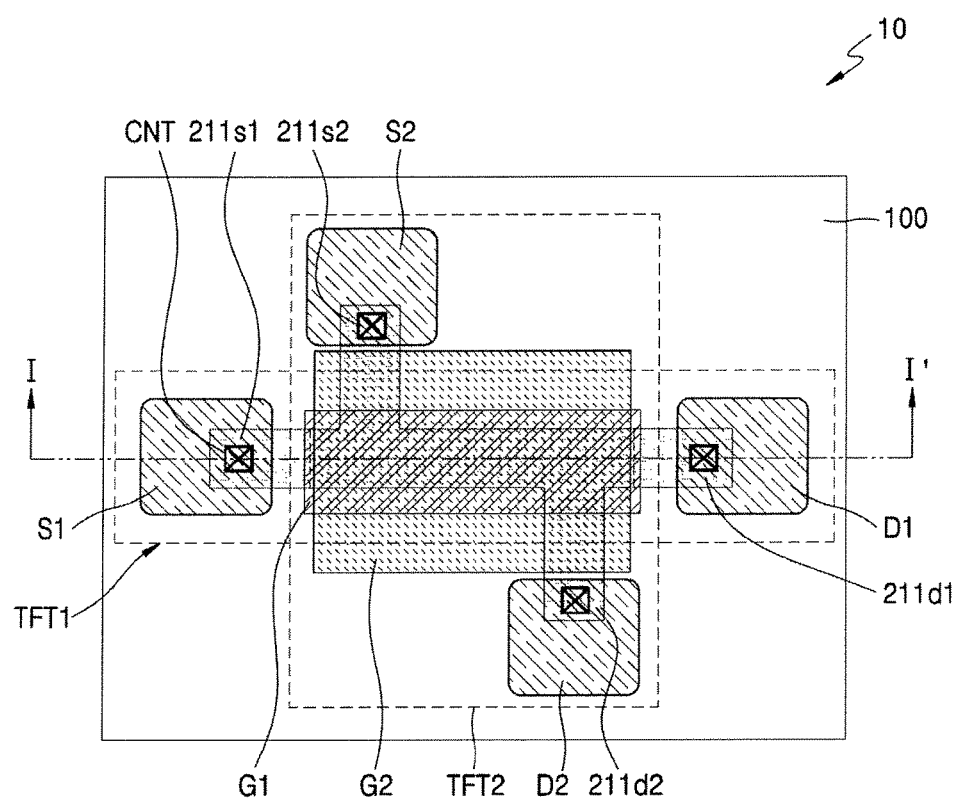
FIG. 1A is a plan view illustrating a semiconductor device according to an exemplary embodiment of the present invention.

Exemplary embodiments of the present inventive concept will be illustrated in the drawings and described in detail herein. An effect and a characteristic of the inventive concept, and a method of accomplishing the same will be apparent when referring to exemplary embodiments described with reference to the drawings. The inventive concept may, however, be embodied in many different forms and should not be construed as limited to the exemplary embodiments set forth herein.

Hereinafter, the inventive concept will be described more fully with reference to the accompanying drawings, in which exemplary embodiments of the inventive concept are illustrated. When description is made with reference to the drawings, like reference numerals in the drawings denote like or corresponding elements, and repeated description thereof may be omitted.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

Sizes of elements in the drawings may be exaggerated for convenience of explanation. Accordingly, since sizes and thicknesses of components in the drawings are arbitrarily illustrated for convenience of explanation, the following embodiments are not limited thereto.

Figure 2:
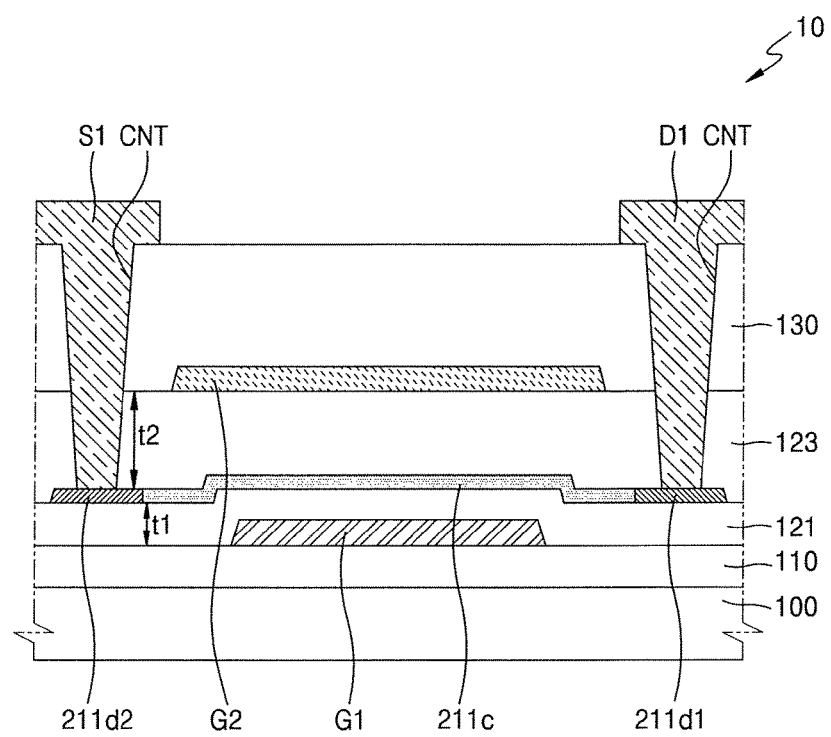
FIG. 2 is a cross-sectional view illustrating a semiconductor device of FIG. 1A along a line I-I' according to an exemplary embodiment of the present invention.

FIG. 1A is a plan view illustrating a semiconductor device according to an exemplary embodiment of the present invention. FIG. 2 is a cross-sectional view illustrating a semiconductor device of FIG. 1A along a line I-I' according to an exemplary embodiment of the present invention.

Referring to FIGS. 1A and 2, the semiconductor device 10 may include a first thin film transistor TFT1 and a second thin film transistor TFT2. The first thin film transistor TFT1 and the second thin film transistor TFT2 may share a channel region 211c of a semiconductor layer 211. The first thin film transistor TFT1 may overlap the second thin film transistor TFT2.

The semiconductor device 10 may include the semiconductor layer 211, a first gate electrode G1, and a second gate electrode G2. The semiconductor layer 211 may include a first source region 211s1, a first drain region 211d1, a second source region 211s2, and second drain region 211d2. The semiconductor layer 211 may extend from the channel region 211c disposed above a substrate 100. The first gate electrode G1 may be disposed below the semiconductor layer 211. The second gate electrode G2 may be disposed above the semiconductor layer 211. The first gate electrode G1 and the second gate electrode G2 may partially overlap the channel region 211c.

The semiconductor device 10 may further include a first gate insulating layer 121. The first gate insulating layer 121 may insulate the first gate electrode G1 from the semiconductor layer 211. The semiconductor device 10 may further include a second gate insulating layer 123. The second gate insulating layer 123 may insulate the second gate electrode G2 from the semiconductor layer 211.

According to an exemplary embodiment of the present invention, the semiconductor device 10 may include the first thin film transistor TFT1 and the second thin film transistor TFT2. The first thin film transistor TFT1 may include the channel region 211c, the first source region 211s1, the first drain region 211d1, and the first gate electrode G1. The second thin film transistor TFT2 may include the channel region 211c, the second source region 211s2, the second drain region 211d2, and the second gate electrode G2.

The semiconductor device 10 may be disposed above the substrate 100. The semiconductor device 10 may further include a source electrode S1, a first drain electrode D1, a second source electrode S2, and a second drain electrode D2. The source electrode S1, the first drain electrode D1, the second source electrode S2, and the second drain electrode D2 may be respectively connected to the first source region 211s1, the first drain region 211d1, the second source region 211s2, and the second drain region 211d2.

The substrate 100 may include various materials such as glass, metal, or plastic; however, exemplary embodiments of the present invention are not limited thereto. According to an exemplary embodiment of the present invention, the substrate 100 may include a flexible substrate 100. The flexible substrate 100 may include a substrate that may be warped, bent, folded or rolled. The substrate 100 may include various materials having a flexible or bendable characteristic. For example, the substrate 100 may include a polymer resin such as polyethersulphone (PES), polyacrylate (PAR), polyetherimide (PEI), polyethylene naphthalate (PEN), polyethyleneterepthalate (PET), polyphenylene sulfide (PPS), polyarylate, polyimide (PI), polycarbonate (PC), or cellulose acetate propionate (CAP); however, exemplary embodiments of the present invention are not limited thereto.

A buffer layer 110 may be disposed above the substrate 100. The buffer layer 110 may reduce or may block penetration of foreign substances, moisture, or external air from below the substrate 100. Furthermore, the buffer layer 110 may provide a planarized surface above the substrate 100. The buffer layer 110 may include an inorganic material such as an oxide or a nitride, or an organic material, or an organic/inorganic composite material; however, exemplary embodiments of the present invention are not limited thereto. The buffer layer 110 may include a single layer or multiple layers of an inorganic material and/or an organic material.

The semiconductor layer 211 may include the channel region 211c, the first source region 211s1, the first drain region 211d1, the second source region 211s2, and the second drain region 211d2 extending from the channel region 211c. When the first thin film transistor TFT1 and second thin film transistor TFT2 are driven, the length of the channel may be determined by a distance between the first and second source regions 211s1, 211s2 and the first and second drain regions 211d1, 211d2, respectively. To ensure a long channel length, the first source region 211s1 may be spaced substantially far apart from the first drain region 211d1 with the channel region 211c disposed therebetween. Similarly, the second source region 211s2 may be spaced substantially far apart from the second drain region 211d2 with the channel region 211c disposed therebetween. As illustrated in FIG. 1A, the first source region 211s1 and the second source region 211s2 may be disposed on a first end portion of the channel region 211c. The first drain region 211d1 and the second drain region 211d2 may be disposed on a second end portion of the channel region 211c. However, exemplary embodiments of the present invention are not limited thereto. The arrangement of the first source region 211s1, the second source region 211s2, the first drain region 211d1, and the second drain region 211d2 may be variously modified and exemplary embodiments of the present invention are not limited thereto. For example, the semiconductor layer 211 may be provided with a '+' shape. The first source region 211s1, the second source region 211s2, the first drain region 211d1, and the second drain region 211d2 may be disposed at edges thereof, respectively.

Figure 1B:
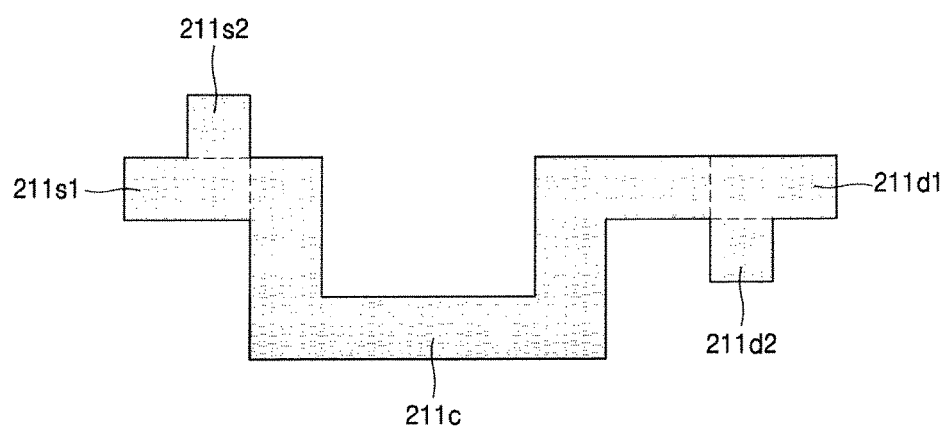
FIG. 1B is a plan view illustrating a semiconductor layer of a semiconductor device according to an exemplary embodiment of the present invention.
Figure 1C:
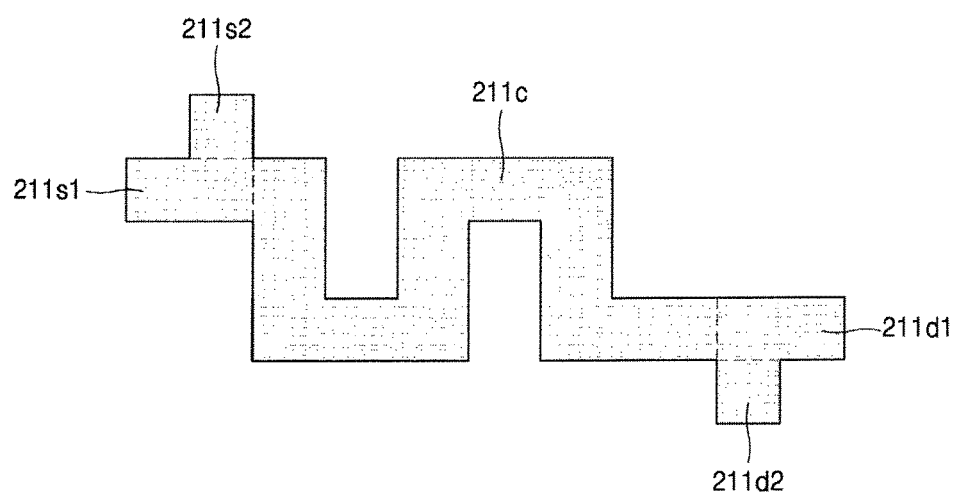
FIG. 1C is a plan view illustrating a semiconductor layer of a semiconductor device according to an exemplary embodiment of the present invention.

The shape of the channel region 211c may be variously modified. As illustrated in FIGS. 1B and 10, the channel region 211c may have a curved shape. The channel region 211c having a curved shape may secure a channel length. As illustrated in FIG. 1B, the channel region 211c may have a "⊏" shape. As illustrated in FIG. 1C, the channel region 211c may have a "ㄹ" shape. The shape of the channel region 211c may be variously modified and exemplary embodiments of the present invention are not limited thereto.

The semiconductor layer 211 may include amorphous silicon (a-Si), polycrystalline silicon (poly-Si), an oxide semiconductor, or an organic semiconductor material; however, exemplary embodiments of the present invention are not limited thereto. When the semiconductor layer 211 includes silicon (Si), the first source region 211s1, the second source region 211s2, the first drain region 211d1, and the second drain region 211d2 may be formed by doping the semiconductor layer 211 with impurities. When the semiconductor layer 211 includes an oxide semiconductor, the first source region 211s1, the second source region 211s2, the first drain region 211d1, and the second drain region 211d2 may be formed by increasing carrier concentration of the oxide semiconductor. Therefore, the oxide semiconductor may be made conductive by a plasma process; however, exemplary embodiments of the present invention are not limited thereto The first gate electrode G1 may be disposed below the channel region 211c. The first gate electrode G1 may partially overlap the channel region 211c. The first gate electrode G1 may be connected to a wiring. The first gate electrode G1 connected to the wiring may apply an ON/OFF signal to the first thin film transistor TFT1. The second gate electrode G2 may be disposed above the channel region 211c. The second gate electrode G2 may partially overlap the channel region 211c. The second gate electrode G2 may be connected to a wiring. The second gate electrode G2 connected to the wiring may apply an ON/OFF signal to the second thin film transistor TFT2. The first gate electrode G1 may overlap the second gate electrode G2.

The first gate electrode G1 and the second gate electrode G2 may include a low resistance metal. For example, the first gate electrode G1 and the second gate electrode G2 may include a conductive material including molybdenum (Mo), aluminum (Al), copper (Cu), and/or titanium (Ti); however, exemplary embodiments of the present invention are not limited thereto. The first gate electrode G1 and the second gate electrode G2 may include a single layer or multiple layers.

The first gate insulating layer 121 may include an inorganic material such as a silicon oxide, a silicon nitride, and/or a silicon oxynitride. The first gate insulating layer 121 may be disposed between the semiconductor layer 211 and the first gate electrode G1. The first gate insulating layer may be configured to insulate an area between the semiconductor layer 211 and the first gate electrode G1. The second gate insulating layer 123 may include an inorganic material such as a silicon oxide, a silicon nitride, and/or a silicon oxynitride. The second gate insulating layer 123 may be disposed between the semiconductor layer 211 and the second gate electrode G2. The second gate insulating layer 123 may be configured to insulate and area between the semiconductor layer 211 and the second gate electrode G2. In addition, an interlayer insulating layer 130 may be disposed above the second gate electrode G2. The interlayer insulating layer 130 may include an inorganic material such as a silicon oxide, a silicon nitride, and/or a silicon oxynitride. The first source electrode S1, the first drain electrode D1, the second source electrode S2, and the second drain electrode D2 may be disposed above the interlayer insulating layer 130. The interlayer insulating layer 130 including an inorganic material may be formed by chemical vapor deposition (CVD) or atomic layer deposition (ALD); however, exemplary embodiments of the present invention are not limited thereto.

A thickness t1 of the first gate insulating layer 121 and a thickness t2 of the second gate insulating layer 123 may be different. A driving range of the first thin film transistor TFT1 and a driving range of the second thin film transistor TFT2 may be adjusted by adjusting the thickness t1 of the first gate insulating layer 121 and the thickness t2 of the second gate insulating layer 123, respectively.

The first source electrode S1, the first drain electrode D1, the second source electrode S2, and the second drain electrode D2 may include a single layer or multiple layers. The first source electrode S1, the first drain electrode D1, the second source electrode S2, and the second drain electrode D2 may include a conductive material having a high conductivity. The first source electrode S1, the first drain electrode D1, the second source electrode S2, and the second drain electrode D2 may be respectively connected to the first source electrode S1, the first drain electrode D1, the second source electrode S2, and the second drain electrode D2 of the semiconductor layer 211. For example, the first source electrode S1, the first drain electrode D1, the second source electrode S2, and the second drain electrode D2 may include a conductive material including aluminum (Al), copper (Cu), and/or titanium (Ti); however, exemplary embodiments of the present invention are not limited thereto. The first source electrode S1, the first drain electrode D1, the second source electrode S2, and the second drain electrode D2 may include a single layer or multiple layers.

The first source electrode S1, the first drain electrode D1, the second source electrode S2, and the second drain electrode D2 may be connected to the semiconductor layer 211 via contact holes CNT. The contact holes CNT may pass through the interlayer insulating layer 130. The contact holes CNT may also pass through the second gate insulating layer 123. The contact holes CNT may be formed by substantially simultaneously etching the interlayer insulating layer 130 and the second gate insulating layer 123.

The first thin film transistor TFT1 and the second thin film transistor TFT2 may be individually driven. For example, when a driving voltage is applied to the first source region 211$s$1, the first drain region 211$d$1, and the first gate electrode G1 of the first thin film transistor TFT1, and the driving voltage is not applied to the second source region 211$s$2, the second drain region 211$d$2, and the second gate electrode G2 of the second thin film transistor TFT2, the first thin film transistor TFT1 may be driven and the second thin film transistor TFT2 might not be driven. When a driving voltage is applied to the first source region 211$s$1, the first drain region 211$d$1, the first gate electrode G1, the second source region 211$s$2, the second drain region 211$d$2, and the second gate electrode G2, the first thin film transistor TFT1 and the second thin film transistor TFT2 may be substantially simultaneously driven.

According to an exemplary embodiment of the present invention, since the semiconductor device 10 may have a structure in which the first thin film transistor TFT1 and second thin film transistor TFT2 sharing the channel region 211$c$ of the semiconductor layer 211 are stacked, a display device including the semiconductor device 10 may allow for high integration.

Figure 3:
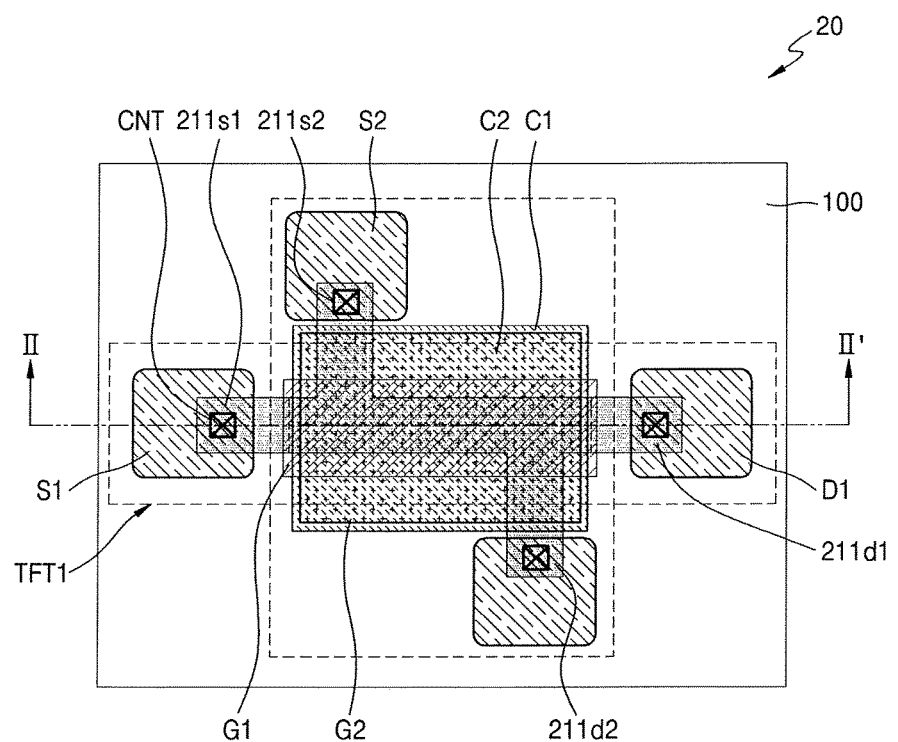
FIG. 3 is a plan view illustrating a semiconductor device according to an exemplary embodiment of the present invention.
Figure 4:
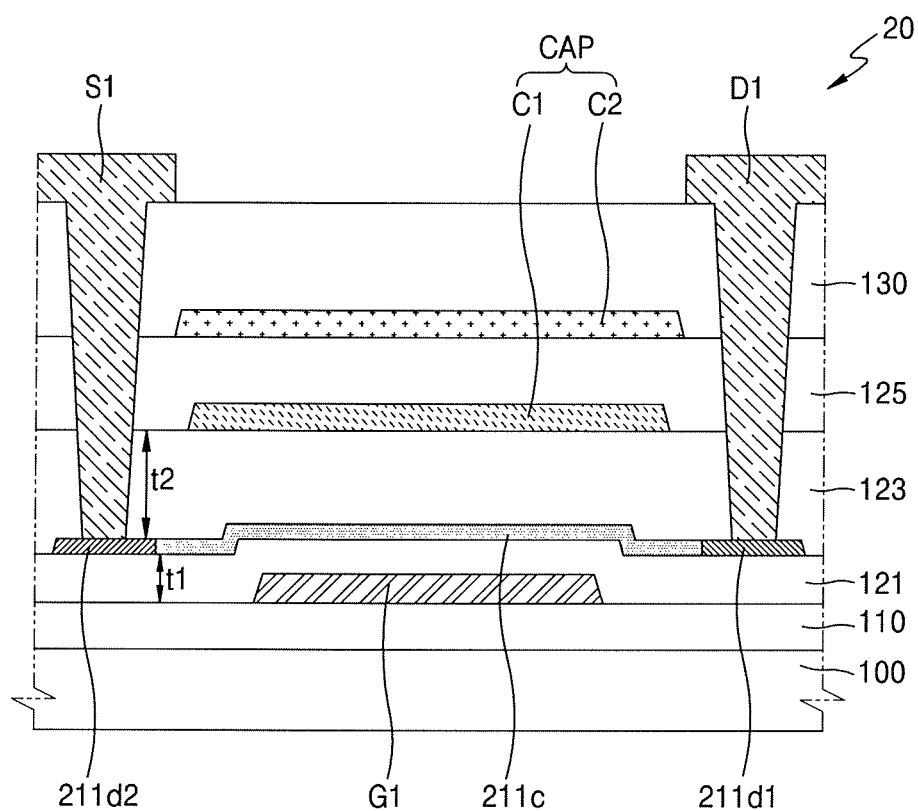
FIG. 4 is a cross-sectional view of a semiconductor device of FIG. 3 along a line I-I' according to an exemplary embodiment of the present invention.

FIG. 3 is a plan view illustrating a semiconductor device 20 according to an exemplary embodiment of the present invention. FIG. 4 is a cross-sectional view illustrating a semiconductor device 20 of FIG. 3 along a line I-I' according to an exemplary embodiment of the present invention.

Referring to FIGS. 3 and 4, the semiconductor device 20 may further include a capacitor CAP. The capacitor CAP may include a first electrode C1. The first electrode C1 may be connected to the second gate electrode G2. The first electrode C1 may also be connected to a second electrode C2. The second electrode C2 may be disposed above the first electrode C1. The second electrode C2 may be insulated from the first electrode C1. The second gate electrode G2 and the first electrode C1 may be integrally provided in the same layer. For example, the second gate electrode G2 may be configured as a gate electrode of the second thin film transistor TFT2. The second gate electrode G2 may substantially simultaneously be configured as an electrode of the capacitor CAP.

A third gate insulating layer 125 may be disposed between the second gate electrode G2 and the second electrode C2. The third gate insulating layer 125 may include an inorganic material such as a silicon oxide, a silicon nitride, and/or a silicon oxynitride; however, exemplary embodiments of the present invention are not limited thereto. The third gate insulating layer 125 may be formed by chemical vapor deposition (CVD) or atomic layer deposition (ALD). The third gate insulating layer 125 may be configured to insulate an area between the second gate electrode G2 and the second electrode C2.

Since the capacitor CAP may overlap the first thin film transistor TFT1 and the second thin film transistor TFT2 in the semiconductor device 20, a high integration may be obtained.

Figure 5A:
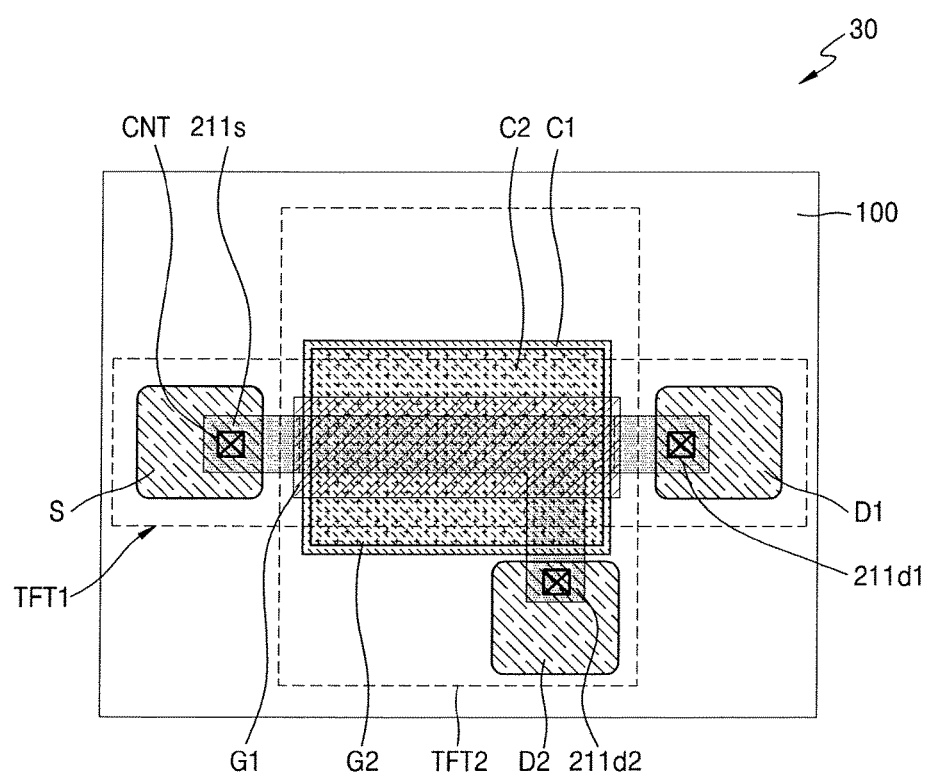
FIG. 5A is a plan view illustrating a semiconductor device according to an exemplary embodiment of the present invention.
Figure 5B:
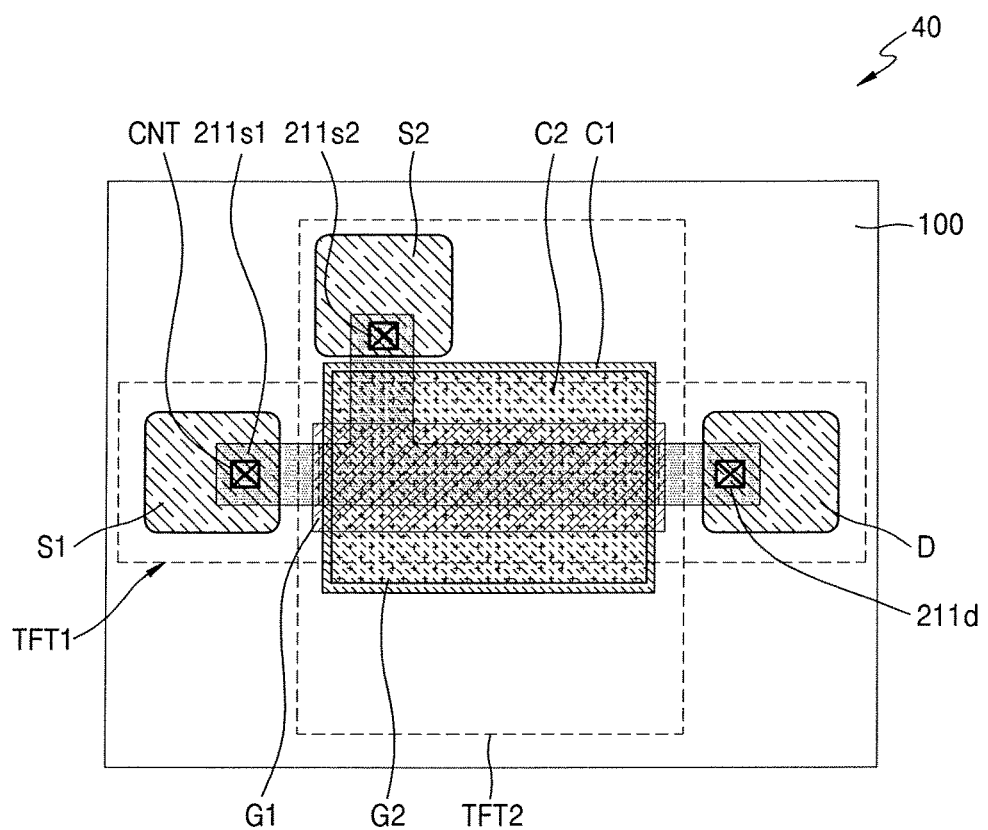
FIG. 5B is a plan view illustrating a semiconductor device according to an exemplary embodiment of the present invention.

FIGS. 5A and 5B are plan views illustrating semiconductor devices 30 and 40, respectively, according to an exemplary embodiment of the present invention.

Referring to FIG. 5A, the first thin film transistor TFT1 and the second thin film transistor TFT2 of the semiconductor device 30 may share a source region. For example, in the semiconductor device 30, the first source region and the second source region may be integrally provided 211$s$. The first drain region 211$d$1 may be spaced apart from the second drain region 211$d$2. Accordingly, the first source electrode and the second source electrode may be integrally provided S.

When substantially a same potential is supplied to the source region of the first thin film transistor TFT1 and the source region of the second thin film transistor TFT2 of the semiconductor device 30, a structure sharing the source region may be provided.

Referring to FIG. 5B, the first thin film transistor TFT1 and the second thin film transistor TFT2 of the semiconductor device 40 may share a drain region. As shown, in the semiconductor device 40, the first source region 211$s$1, may be spaced apart from the second source region 211$s$2. The first drain region and the second drain region may be integrally provided 211$d$. Accordingly, the first drain electrode and the second drain electrode may be integrally provided D.

When substantially a same potential is supplied to the drain region of the first thin film transistor TFT1 and the drain region of the second thin film transistor TFT2 of the semiconductor device 40, a structure sharing the drain region may be provided.

The semiconductor devices 10, 20, 30, and 40 and modifications thereof may be applied to a display device.

A display device is an apparatus displaying an image. The display device may be a liquid crystal display (LCD), an electrophoretic display, an organic light-emitting display (OLED), an inorganic light-emitting display, a field emission display, a surface-conduction electron-emitter display, a plasma display, a cathode ray display; however, exemplary embodiments of the present invention are not limited thereto.

Although an organic light-emitting display (OLED) device according to an exemplary embodiment of the present invention is described herein, exemplary embodiments of the present invention are not limited thereto and various types of display devices may be used.

Figure 6:
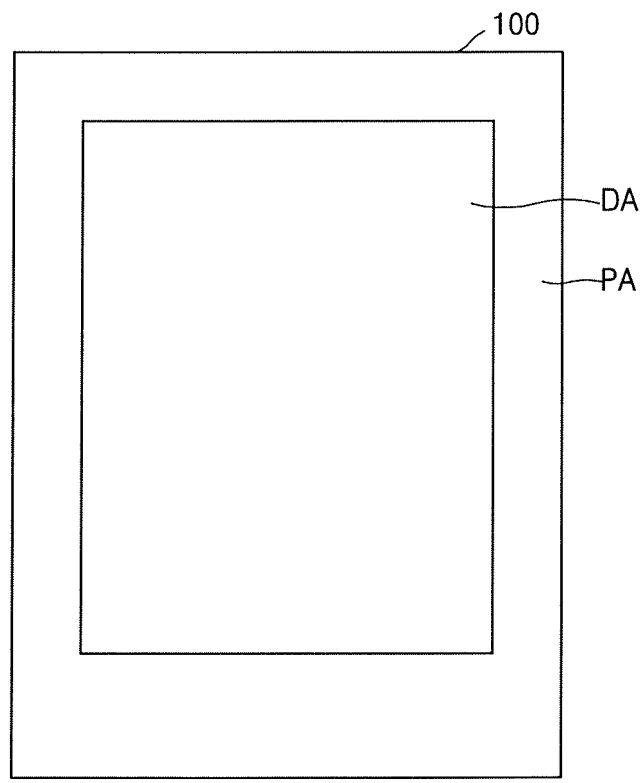
FIG. 6 is a plan view illustrating a portion of a display device according to an exemplary embodiment of the present invention.

FIG. 6 is a plan view illustrating a portion of a display device according to an exemplary embodiment of the present invention. As illustrated in FIG. 6, the display device may include the substrate 100. As illustrated in FIG. 6, the substrate 100 of the display device may include a display area DA. The substrate 100 of the display device may further include a peripheral area PA. The peripheral area PA may be disposed outside the display area DA. Various display elements such as an organic light-emitting diode (OLED) may be disposed on the display area DA of the substrate 100. Various wirings may be disposed on the peripheral area PA of the substrate 100. The various wirings may transfer an electric signal. The electric signal of the various wirings may be applied to the display area DA.

Figure 7:
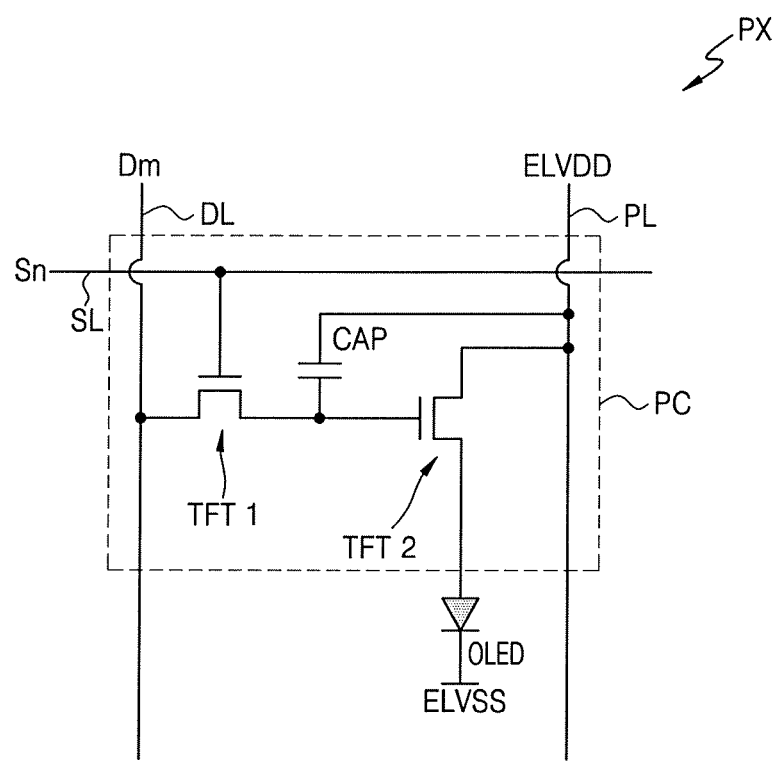
FIG. 7 is an equivalent circuit diagram illustrating a pixel of a display device of FIG. 6 according to an exemplary embodiment of the present invention.

FIG. 7 is an equivalent circuit diagram illustrating a pixel of a display device of FIG. 6 according to an exemplary embodiment of the present invention. FIG. 7 illustrates a pixel including an organic light-emitting diode OLED according to an exemplary embodiment of the present invention.

Referring to FIG. 7, each pixel PX may include a pixel circuit PC. The pixel circuit PC may be connected to a scan line SL. The pixel circuit PC may further be connected to a data line DL. An organic light-emitting diode OLED may be connected to the pixel circuit PC.

The pixel circuit PC may include a first thin film transistor TFT1, a second thin film transistor TFT2, and a capacitor CAP. The first thin film transistor TFT1 may be connected to a scan line SL. The first thin film transistor TFT1 may further be connected to a data line DL. The first thin film transistor TFT1 may transfer a data signal Dm input via the data line DL to the second thin film transistor TFT2 in response to a scan signal Sn input via the scan line SL.

The capacitor CAP may be connected to the first thin film transistor TFT1. The capacitor CAP may further be connected to a driving voltage line PL. The capacitor CAP may store a voltage. The voltage may correspond to a difference between a voltage received from the first thin film transistor TFT1 and a driving voltage ELVDD supplied to the driving voltage line PL.

The second thin film transistor TFT2 may be connected to the driving voltage line PL. The second thin film transistor TFT2 may further be connected to the capacitor CAP. The second thin film transistor TFT2 may control a driving current. The driving current may flow through the organic light-emitting diode OLED from the driving voltage line PL in response to a voltage value stored in the capacitor CAP. The organic light-emitting diode OLED may emit light. The light emitted by the organic light-emitting diode OLED may have a predetermined brightness by using the driving current.

Figure 8:
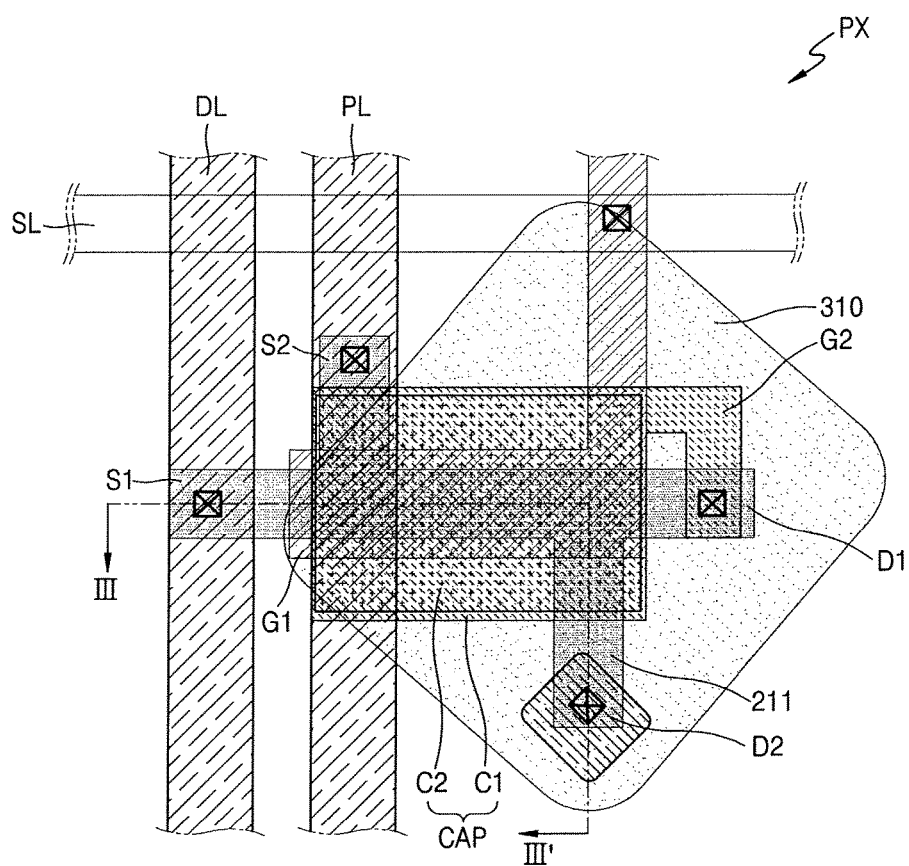
FIG. 8 is a plan view illustrating a pixel of a display device of FIG. 6 according to an exemplary embodiment of the present invention.
Figure 9:
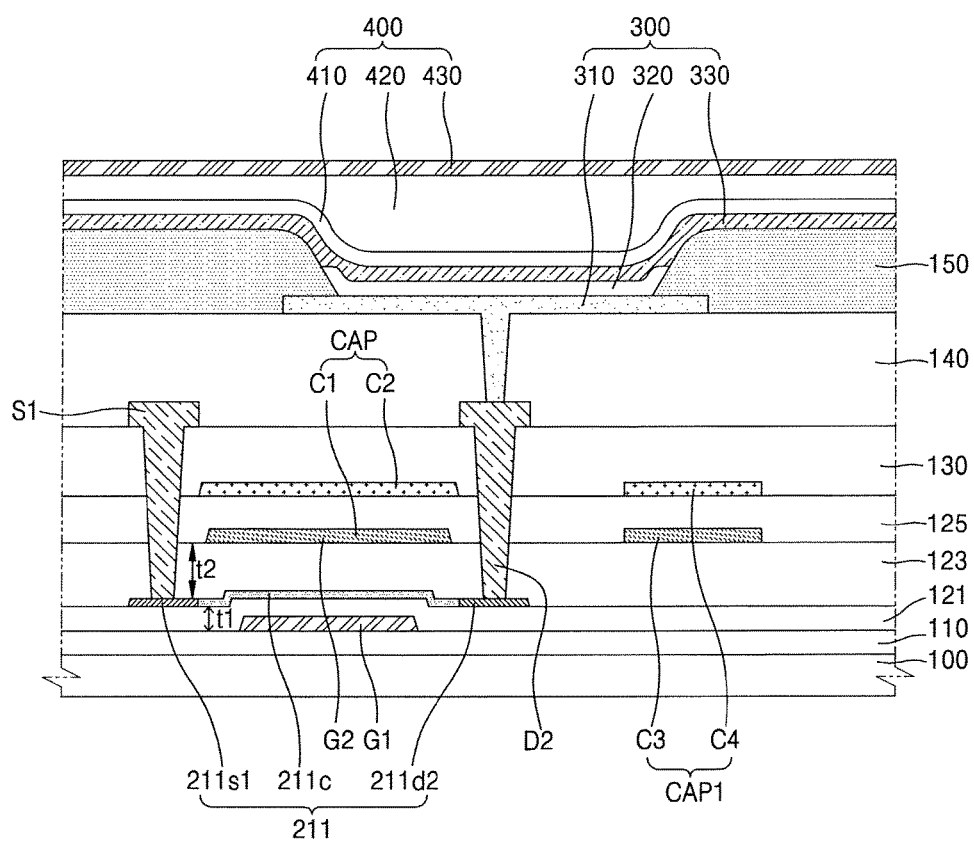
FIG. 9 is a cross-sectional view illustrating a pixel of a display device of FIG. 6 along a line II-II" of FIG. 8 according to an exemplary embodiment of the present invention.

FIG. 8 is a plan view illustrating a pixel of a display device of FIG. 6 according to an exemplary embodiment of the present invention. FIG. 9 is a cross-sectional view illustrating a pixel along a line II-II" of FIG. 8 according to an exemplary embodiment of the present invention.

Referring to FIGS. 8 and 9, in addition to the semiconductor device 20 as illustrated in FIG. 4, the display device may include various signal lines. The various signal lines may include a scan line SL, a data line DL, a driving voltage line PL, and a display element. The display element may include an organic light-emitting diode (OLED) 300. The signal lines may be shared by a plurality of pixels.

The semiconductor device may include the first thin film transistor TFT1 and the second thin film transistor TFT2. The organic light-emitting diode (OLED) 300 may be connected to the first thin film transistor TFT1. Alternatively, the organic light-emitting diode (OLED) 300 may be connected to the second thin film transistor TFT2. As illustrated in FIG. 9, the organic light-emitting diode (OLED) 300 may be connected to the second thin film transistor TFT2. Accordingly, the second thin film transistor TFT2 may be configured as a driving thin film transistor. The driving thin film transistor may drive the organic light-emitting diode (OLED) 300. The first thin film transistor TFT1 may be configured as a switching thin film transistor.

When the second thin film transistor TFT2 is configured as the driving thin film transistor, the second thin film transistor TFT2 may require driving. Accordingly, finer adjustment than the first thin film transistor TFT1 may be provided. Since a driving range may be adjusted by a thickness t1 of the second gate insulating layer 123, a finer adjustment may be achieved by the thickness t1 of the second gate insulating layer 123 greater than the thickness t2 of the first gate insulating layer 121.

The display device may further include an auxiliary capacitor CAP1. The auxiliary capacitor CAP1 might not overlap the semiconductor device. The auxiliary capacitor CAP1 may include a third electrode C3. The auxiliary capacitor CAP1 may further include a fourth electrode C4. The fourth capacitor C4 may overlap the third electrode C3. An insulating layer may be disposed between the third electrode C3 and the fourth electrode C4. The insulating layer may be configured as a dielectric layer. As illustrated in FIG. 9, the third gate insulating layer 125 may be disposed between the third electrode C3 and the fourth electrode C4. As also illustrated in FIG. 9, the third electrode C3 may be spaced apart from the second gate electrode G2. The third electrode C3 may include substantially the same material as the second gate electrode G2. The third electrode C3 may be disposed in the same layer as the second gate electrode G2. The fourth electrode C4 may be spaced apart from the second electrode C2 of the capacitor CAP. The fourth electrode C4 may include substantially the same material as the second electrode C2. The fourth electrode C4 may be disposed on the same layer as the second electrode C2. However, exemplary embodiments of the present invention are not limited thereto. For example, the interlayer insulating layer 130 may be disposed between the third electrode C3 and the fourth electrode C4. The third electrode C3 may be disposed on the same layer as the second electrode C2. The fourth electrode C4 may be disposed on the same layer as the first source electrode S1; however, exemplary embodiments of the present invention are not limited thereto. The auxiliary capacitor CAP1 may be connected to the capacitor CAP. The auxiliary capacitor CAP1 may be configured as a storage capacitor.

According to an exemplary embodiment of the present invention, since the capacitor CAP may overlap the first thin film transistor TFT1 and the second thin film transistor TFT2, the display device may secure an additional space for forming the auxiliary capacitor CAP1.

As illustrated in FIG. 8, the gate line GL may be connected to the first gate electrode G1. The data line DL may be connected to the first source electrode S1. The driving voltage line PL may be connected to the second source electrode S2; however, exemplary embodiments of the present invention are not limited thereto and various modifications may be provided depending on the configuration of the first thin film transistor TFT1 and the second thin film transistor TFT2.

A planarization layer 140 may be disposed above the semiconductor device. For example, when the organic light-emitting diode (OLED) 300 is disposed above the semiconductor device as illustrated in FIG. 9, the planarization layer 140 may generally planarize an upper portion of a protective layer covering the semiconductor device 20. The planarization layer 140 may include an organic material such as an acryl, benzocyclobutene (BCB), or hexamethyldisiloxane (HMDSO); however, exemplary embodiments of the present invention are not limited thereto. As illustrated in FIG. 9, the planarization layer 140 may include a single layer. The planarization layer 140 may also include multiple layers. However, exemplary embodiments of the present invention are not limited thereto and various modifications may be made.

The organic light-emitting diode (OLED) 300 may be disposed above the planarization layer 140. The organic light-emitting diode (OLED) 300 may include a pixel electrode 310, an opposite electrode 330, and an intermediate layer 320. The intermediate layer 320 may be disposed between the pixel electrode 310 and the opposite electrode 330. The intermediate layer may include an emission layer. The pixel electrode 310 may be connected to the first thin film transistor TFT1. Alternatively, the pixel electrode 310 may be connected to the second thin film transistor TFT2. Referring to FIGS. 8 and 9, the pixel electrode 310 may be connected to the first film transistor TFT1 or the second thin film transistor TFT2 by contacting one of the first source electrode S1, the first drain electrode D1, the second source electrode S2, or the second drain electrode D2 via an opening in the planarization layer 140. As illustrated in FIGS. 8 and 9, the pixel electrode 310 may be connected to the second drain electrode D2.

The pixel electrode 310 may be provided as a transparent electrode. Alternatively, the pixel electrode 310 may be provided as a reflective electrode. When the pixel electrode 310 is a transparent electrode, the pixel electrode 310 may include indium tin oxide (ITO), indium zinc oxide (IZO), zinc oxide (ZnO), or indium(III) oxide (In$_2$O$_3$). When the pixel electrode 310 is a reflective electrode, the pixel electrode 310 may include a reflective layer and a transparent layer. The reflective layer may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The transparent layer may include indium tin oxide (ITO), indium zinc oxide (IZO), zinc oxide (ZnO), or indium(III) oxide (In$_2$O$_3$). According to an exemplary embodiment of the present invention, the pixel electrode 310 may have a structure of indium tin oxide (ITO)/silver (Ag)/indium tin oxide (ITO).

A pixel-defining layer 150 may be disposed above the planarization layer 140. The pixel-defining layer 150 may define a pixel by having an opening corresponding to respective sub-pixels. As such, the pixel-defining layer 150 may define a pixel by having an opening exposing at least the central portion of the pixel electrode 310. As illustrated in FIG. 9, the pixel-defining layer 150 may prevent an arc or the like from occurring at the edge of the pixel electrode 310. The pixel-defining layer 150 may increase a distance between an edge of the pixel electrode 310 and the opposite electrode 330 disposed above the pixel electrode 310. The pixel-defining layer 150 may include an organic material, such as polyimide (PI) or hexamethyldisiloxane (HMDSO); however, exemplary embodiments of the present invention are not limited thereto.

The intermediate layer 320 of the organic light-emitting diode (OLED) 300 may include a low molecular material or a polymer material. When the intermediate layer 320 includes a low molecular material, the intermediate layer 320 may have a structure in which a hole injection layer (HIL), a hole transport layer (HTL), an organic emission layer (EML), an electron transport layer (ETL), an electron injection layer (EIL) are stacked in a single or composite structure. The intermediate layer 320 may include organic materials such as copper phthalocyanine (CuPc), N,N'-Di (naphthalene-1-yl)-N,N'-diphenyl-benzidine (NPB), and tris-8-hydroxyquinoline aluminum (Alq3); however, exemplary embodiments of the present invention are not limited thereto. Layers of the intermediate layer 320 may be formed by using a vacuum deposition method.

When the intermediate layer 320 includes a polymer material, the intermediate layer 320 may have a structure including an hole transport layer (HTL) and an organic emission layer (EML). The hole transport layer (HTL) may include a poly(3,4-ethylenedioxythiophene) (PEDOT). The organic emission layer (EML) may include a polymer material such as a poly-phenylenevinylene (PPV)-based material and/or a polyfluorene-based material; however, exemplary embodiments of the present invention are not limited thereto. The intermediate layer 320 may be formed by using screen printing, an inkjet printing method, or laser induced thermal imaging (LITI); however, exemplary embodiments of the present invention are not limited thereto.

The intermediate layer 320 may have various structures. The intermediate layer 320 may include a layer integrally formed over a plurality of pixel electrodes 310. The intermediate layer 320 may also include a layer patterned to correspond to the plurality of pixel electrodes 310.

The opposite electrode 330 may face toward the pixel electrode 310. The intermediate layer 320 may be disposed between the opposite electrode 330 and the pixel electrode 310. The opposite electrode 330 may be integrally disposed on a plurality of organic light-emitting diodes (OLEDs) 300. The opposite electrode 330 may correspond to the plurality of pixel electrodes 310. For example, the pixel electrode 310 may be patterned at substantially every pixel. The opposite electrode 330 may be formed such that a common voltage may be applied to substantially all pixels. The opposite electrode 330 may be a transparent electrode. Alternatively, the opposite electrode 330 may be a reflective electrode.

A hole and an electron injected from the pixel electrode 310 and the opposite electrode 330 of the organic light-emitting diode (OLED) 300 may combine in the emission layer of the intermediate layer 320 and thereby emit light.

Since the organic light-emitting diode (OLED) 300 may be easily damaged by external moisture or oxygen or the like, a thin film encapsulation layer 400 may cover and may protect the organic light-emitting diodes (OLEDs). The thin film encapsulation layer 400 may include at least one organic encapsulation layer. The thin film encapsulation layer 400 may further include at least one inorganic encapsulation layer. For example, the thin film encapsulation layer 400 may include a first inorganic encapsulation layer 410, an organic encapsulation layer 420, and a second inorganic encapsulation layer 430 as illustrated in FIG. 9.

The first inorganic encapsulation layer 410 may cover the opposite electrode 330. The first inorganic encapsulation layer 410 may include a silicon oxide, a silicon nitride, and/or a silicon oxynitride; however, exemplary embodiments of the present invention are not limited thereto. Other layers such as a capping layer may be disposed between the first inorganic encapsulation layer 410 and the opposite electrode 330. As illustrated in FIG. 9, since the first inorganic encapsulation layer 410 may be disposed along a structure disposed therebelow, an upper surface of the first inorganic encapsulation layer 410 may not be planarized. The organic encapsulation layer 420 may cover the first inorganic encapsulation layer 410. Dissimilar to the first inorganic encapsulation layer 410, an upper surface of the organic encapsulation layer 420 may be approximately substantially planarized. The organic encapsulation layer 420 may include at least one of polyethyleneterepthalate (PET), polyethylene naphthalate (PEN), polycarbonate (PC), polyimide (PI), polyethylene sulphonate, polyoxy methylene (POM), polyacrylate (PAR), and hexamethyldisiloxane (HMDSO); however, exemplary embodiments of the present invention are not limited thereto. The second inorganic encapsulation layer 430 may cover the organic encapsulation layer 420. The second inorganic encapsulation layer 430 may include a silicon oxide, a silicon nitride, and/or a silicon oxynitride; however, exemplary embodiments of the present invention are not limited thereto.

Since the thin film encapsulation layer 400 may include the first inorganic encapsulation layer 410, the organic encapsulation layer 420, and the second inorganic encapsulation layer 430, when a crack occurs inside the encapsulation layer 400, the crack may not be allowed to be connected between the first inorganic encapsulation layer 410 and the organic encapsulation layer 420 or between the organic encapsulation layer 420 and the second inorganic encapsulation layer 430 due to the multi-layered structure. Therefore, forming of a path via external moisture or oxygen may penetrates into the organic light-emitting diode (OLED) 300 may be prevented or may be minimized.

Referring to FIGS. 6 and 9, the thin film encapsulation layer 400 may be replaced with a sealing substrate. The sealing substrate may include glass or the like. The sealing substrate may be attached to the substrate 100 by a sealing member. The sealing member may surround the display area DA. In addition, a polarization plate, a color filter, a touch panel or the like may be further disposed above the thin film encapsulation layer 400 or the sealing substrate.

According to an exemplary embodiment of the present invention, since the display device may include the semiconductor device 10, 20, 30, or 40 having a structure in which the first thin film transistor TFT1 and the second thin film transistor TFT2 sharing the channel region of the semiconductor layer are stacked, high integration may be implemented.

While the inventive concept has been described with reference to the exemplary embodiments illustrated in the drawings, it will be understood by one of ordinary skill in the art that various changes in form and details and equivalents thereof may be made therein without departing from the spirit and scope of the inventive concept as defined by the following claims.

What is claimed is:
1. A semiconductor device, comprising:
   a semiconductor layer, the semiconductor layer comprising a first source region, a first drain region, a second source region, and a second drain region connected to a channel region;
   a first gate electrode disposed below the semiconductor layer, the first gate electrode insulated from the semiconductor layer by a first gate insulating layer, and at least partially overlapping the channel region; and
   a second gate electrode disposed above the semiconductor layer, the second gate electrode insulated by a second gate insulating layer, and at least partially overlapping the channel region.

2. The semiconductor device of claim 1, wherein a first thin film transistor comprises the channel region, the first source region, the first drain region, and the first gate electrode, and
   a second thin film transistor comprises the channel region, the second source region, the second drain region, and the second gate electrode.

3. The semiconductor device of claim 1, wherein a thickness of the first gate insulating layer is different than a thickness of the second gate insulating layer.

4. The semiconductor device of claim 1, further comprising:
   an interlayer insulating layer disposed above the second gate electrode; and
   a first source electrode, a first drain electrode, a second source electrode, and a second drain electrode disposed above the interlayer insulating layer, wherein the first source electrode, the first drain electrode, the second source electrode, and the second drain electrode are respectively connected to the first source region, the first drain region, the second source region, and the second drain region via contact holes.

5. The semiconductor device of claim 1, further comprising:
   a capacitor comprising a first electrode and a second electrode,
   wherein the first electrode is connected to the second gate electrode,
   wherein the second electrode is disposed above the first electrode and insulated from the first electrode, and
   wherein the second gate electrode and the first electrode form a single structure in a same layer.

6. The semiconductor device of claim 5, wherein the capacitor comprises a third gate insulating layer, the third gate insulating layer disposed between the first electrode and the second electrode.

7. The semiconductor device of claim 1, wherein the first source region, the first drain region, the second source region, and the second drain region are spaced apart from each other.

8. The semiconductor device of claim 1, wherein the first source region and the second source region form a single region, and the first drain region is spaced apart from the second drain region.

9. The semiconductor device of claim 1, wherein the first source region is spaced apart from the second source region, and the first drain region and the second drain region form a single region.

10. A display device, comprising:
    the semiconductor device of claim 1;
    a planarization layer covering the semiconductor device;
    a pixel electrode disposed above the planarization layer and connected to one of the first source region, the first drain region, the second source region, or the second drain region;

an opposite electrode facing the pixel electrode; and
an intermediate layer disposed between the pixel electrode and the opposite electrode.

11. The display device of claim 10, wherein a first thin film transistor comprises the channel region, the first source region, the first drain region, and the first gate electrode, and
a second thin film transistor comprises the channel region, the second source region, the second drain region, and the second gate electrode.

12. The display device of claim 10, further comprising:
a gate line configured to transfer a gate signal, a data line configured to transfer a data signal, and a driving voltage line configured to transfer a driving voltage, wherein the gate line is connected to the first gate electrode, the data line is connected to the first source region, the driving voltage line is connected to the second source region, and the pixel electrode is connected to the second drain region.

13. The display device of claim 12, wherein a thickness of the second gate insulating layer is greater than a thickness of the first gate insulating layer.

14. The display device of claim 10, further comprising:
a capacitor comprising a first electrode connected to the second gate electrode and a second electrode disposed above the first electrode and insulated from the first electrode,
wherein the second gate electrode and the first electrode form a single structure in a same layer.

15. The display device of claim 14, wherein the capacitor comprises a third gate insulating layer disposed between the first electrode and the second electrode.

16. The display device of claim 10, further comprising an auxiliary capacitor, wherein the auxiliary capacitor does not overlap the semiconductor device.

17. The display device of claim 10, further comprising a pixel-defining layer, wherein the pixel-defining layer exposes a portion of the pixel electrode, covers a surface of the pixel electrode, and defines a pixel.

18. The display device of claim 10, wherein the intermediate layer comprises an organic emission layer.

19. A semiconductor device, comprising:
a substrate;
a semiconductor layer including a channel region disposed above the substrate;
a first gate electrode, the first gate electrode at least partially overlapping the channel region;
a second gate electrode disposed above the semiconductor layer, the second gate electrode at least partially overlapping the channel region;
wherein the semiconductor layer overlaps the first gate electrode when viewed from above the semiconductor layer towards the substrate.

20. The semiconductor device of claim 19, wherein the semiconductor layer further comprises a first source region, a first drain region, a second source region, and a second drain region.

21. The semiconductor device of claim 20, wherein a first thin film transistor comprises the channel region, the first source region, the first drain region, and the first gate electrode, and
a second thin film transistor comprises the channel region, the second source region, the second drain region, and the second gate electrode.

22. The semiconductor device of claim 19, wherein the first gate electrode is insulated by a first gate insulating layer, and the second gate electrode is insulated by a second gate insulating layer.

23. The semiconductor device of claim 22, wherein a thickness of the first gate insulating layer is different than a thickness of the second gate insulating layer.

* * * * *